US012733560B2

(12) United States Patent
Srivastava et al.

(10) Patent No.: US 12,733,560 B2
(45) Date of Patent: Sep. 8, 2026

(54) HYBRID BONDING WITH SELECTIVELY FORMED DIELECTRIC MATERIAL

(71) Applicant: GLOBALFOUNDRIES U.S. Inc., Malta, NY (US)

(72) Inventors: Ravi Prakash Srivastava, Clifton Park, NY (US); Matthew Charles Gorfien, Saratoga Springs, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 373 days.

(21) Appl. No.: 18/504,526

(22) Filed: Nov. 8, 2023

(65) Prior Publication Data

US 2025/0149499 A1 May 8, 2025

(51) Int. Cl.

*H10W 99/00* (2026.01)
*H10W 72/90* (2026.01)
*H10W 80/00* (2026.01)

(52) U.S. Cl.

CPC ........... *H10W 99/00* (2026.01); *H10W 72/90* (2026.01); *H10W 72/9445* (2026.01); *H10W 72/951* (2026.01); *H10W 72/952* (2026.01); *H10W 80/312* (2026.01); *H10W 80/327* (2026.01)

(58) Field of Classification Search

CPC ............. H10W 80/312; H10W 80/327; H10W 80/337; H10W 72/90; H10W 72/9445
See application file for complete search history.

(56) References Cited

U.S. PATENT DOCUMENTS

| | | | | |
|---|---|---|---|---|
| 8,159,060 | B2 | 4/2012 | Barth et al. | |
| 8,809,123 | B2 | 8/2014 | Liu et al. | |
| 9,666,566 | B1 | 5/2017 | Chen et al. | |
| 9,960,129 | B2 | 5/2018 | Liu et al. | |
| 11,004,757 | B2 * | 5/2021 | Katkar | H01L 23/10 |
| 11,011,494 | B2 * | 5/2021 | Gao | H01L 24/83 |
| 11,244,916 | B2 * | 2/2022 | Uzoh | H01L 24/08 |
| 11,244,920 | B2 * | 2/2022 | Uzoh | H01L 24/20 |
| 11,264,345 | B2 * | 3/2022 | Enquist | H01L 24/09 |

(Continued)

OTHER PUBLICATIONS

Christopher Netzband et al., Wet Atomic Layer Etching of Copper Structures for Highly Scaled Copper Hybrid Bonding and Fully Aligned Vias, 2022 IEEE 72nd Electronic Components and Technology Conference (ECTC), Jun. 3, 2022, pp. 707-711, IEEE DOI 10.1109/ECTC51906.2022.00118.

(Continued)

*Primary Examiner* — Bac H Au

(57) ABSTRACT

A method for hybrid bonding a first semiconductor substrate to a second semiconductor substrate includes forming a first plurality of metal pads on a face of the first substrate, forming a second plurality of metal pads on a face of the second substrate, selectively forming a first dielectric layer over a first insulating material of the first substrate, selectively forming a second dielectric layer over a second insulating material of the second substrate, placing the face of the first substrate against the face of the second substrate so that the first dielectric layer contacts the second dielectric layer, and heating the first substrate and the second substrate to bond the first plurality of metal pads to the second plurality of metal pads. The first and second dielectric layers may be formed by an area selective deposition process.

20 Claims, 6 Drawing Sheets

(56) References Cited

U.S. PATENT DOCUMENTS

| | | | | |
|---|---|---|---|---|
| 11,393,779 | B2 * | 7/2022 | Gao | H01L 23/481 |
| 11,735,523 | B2 * | 8/2023 | Uzoh | H01L 21/7682 257/773 |
| 11,804,458 | B2 * | 10/2023 | Zhan | H01L 23/522 |
| 11,854,835 | B2 * | 12/2023 | Lii | H01L 21/4857 |
| 11,973,045 | B2 * | 4/2024 | Chuang | H01L 24/05 |
| 12,191,267 | B2 * | 1/2025 | Haba | H01L 24/03 |
| 12,266,622 | B2 * | 4/2025 | Lo | H01L 24/05 |
| 12,456,662 | B2 * | 10/2025 | Fountain, Jr. | H01L 21/76898 |
| 12,506,114 | B2 * | 12/2025 | Uzoh | H01L 24/80 |
| 2013/0299986 | A1 * | 11/2013 | Sun | H01L 21/561 438/118 |
| 2015/0171050 | A1 * | 6/2015 | Chen | H01L 21/324 257/784 |
| 2019/0096842 | A1 * | 3/2019 | Fountain, Jr. | H01L 21/3212 |
| 2021/0082832 | A1 * | 3/2021 | Yang | H10W 20/037 |
| 2021/0098290 | A1 * | 4/2021 | Hsueh | H10W 20/069 |
| 2021/0249305 | A1 * | 8/2021 | Tapily | H10W 20/069 |
| 2023/0108117 | A1 * | 4/2023 | Voronin | H01J 37/32449 438/107 |
| 2023/0299040 | A1 * | 9/2023 | Gupta | H01L 24/80 257/782 |
| 2024/0047343 | A1 * | 2/2024 | Tong | H01L 23/5226 |
| 2024/0170444 | A1 * | 5/2024 | Lefevre | H10W 99/00 |
| 2024/0234363 | A1 * | 7/2024 | Lefevre | H10W 72/90 |
| 2025/0006674 | A1 * | 1/2025 | Uzoh | H01L 24/05 |

OTHER PUBLICATIONS

Cheng-Ta Ko et al., Wafer-to-Wafer Hybrid Bonding Technology for 3D IC, IEEE Xplore, Oct. 2010, pp. 1-4.

* cited by examiner

HYBRID BONDING WITH SELECTIVELY FORMED DIELECTRIC MATERIAL

BACKGROUND

The semiconductor industry continues to improve the integration density of electronic components by various techniques, including reducing the minimum feature size of devices and using devices with vertical orientations. Another technique is to bond two stacked substrates to one another to form a three-dimensional integrated circuit (3DIC). 3DICs can be formed by bonding a wafer to another wafer, bonding a die to a wafer, or bonding a die to another die. 3DIC bonding was conventionally performed by fusing metal bumps on the bonding surfaces as an interconnect scheme.

Hybrid bonding has recently emerged as a promising technique to replace bumps. In hybrid bonding, no metal bumps are used-instead, opposing substrate surfaces are placed against one another and heated so that both dielectric-to-dielectric and direct metal-to-metal bonds are formed between the two surfaces. Hybrid bonding can accommodate lower pitch sizes, increasing interconnect density compared to bumps.

There are several challenges with hybrid bonding. Minor deviations in the bonding surfaces can lead to gaps in the bonded substrates which can prevent contact between metal pads. It is difficult to achieve an even surface, especially when metal pad density variations are present. The bonding process involves heating the substrates, and the metal expands more than the dielectric, so the metal pads should be recessed below the dielectric with a high degree of precision.

SUMMARY

Embodiments of the present disclosure relate to methods for hybrid bonding a first semiconductor substrate to a second semiconductor substrate including selectively forming a dielectric material over insulator portions of the face of the substrate to recess metal pads.

In an embodiment, a method for hybrid bonding a first semiconductor substrate to a second semiconductor substrate includes forming a first plurality of metal pads on a face of the first substrate, forming a second plurality of metal pads on a face of the second substrate, selectively forming a first dielectric layer over a first insulating material of the first substrate, selectively forming a second dielectric layer over a second insulating material of the second substrate, placing the face of the first substrate against the face of the second substrate so that the first dielectric layer contacts the second dielectric layer, and heating the first substrate and the second substrate to bond the first plurality of metal pads to the second plurality of metal pads.

In an embodiment, a method for hybrid bonding a first semiconductor substrate to a second semiconductor substrate includes forming a first plurality of metal pads on a face of the first substrate, forming a second plurality of metal pads on a face of the second substrate, selectively forming a first dielectric layer over a first insulating material of the first substrate, selectively forming a second dielectric layer over a second insulating material of the second substrate, placing the face of the first substrate against the face of the second substrate so that the first dielectric layer contacts the second dielectric layer, and heating the first substrate and the second substrate to bond the first plurality of metal pads to the second plurality of metal pads, the first and second dielectric layers are formed by an area selective deposition process, and no dummy pads are present on the faces of the first and second substrates.

DETAILED DESCRIPTION

Embodiments of the present disclosure relate to methods for hybrid bonding using selective deposition to form dielectric layers on bonding faces.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For clarity, technical material that is known in the technical fields related to this disclosure has not been described in detail so that the disclosure is not unnecessarily obscured. The figures are not drawn to scale, and some features are intentionally enlarged or diminished for emphasis and visual clarity.

Figure 1:
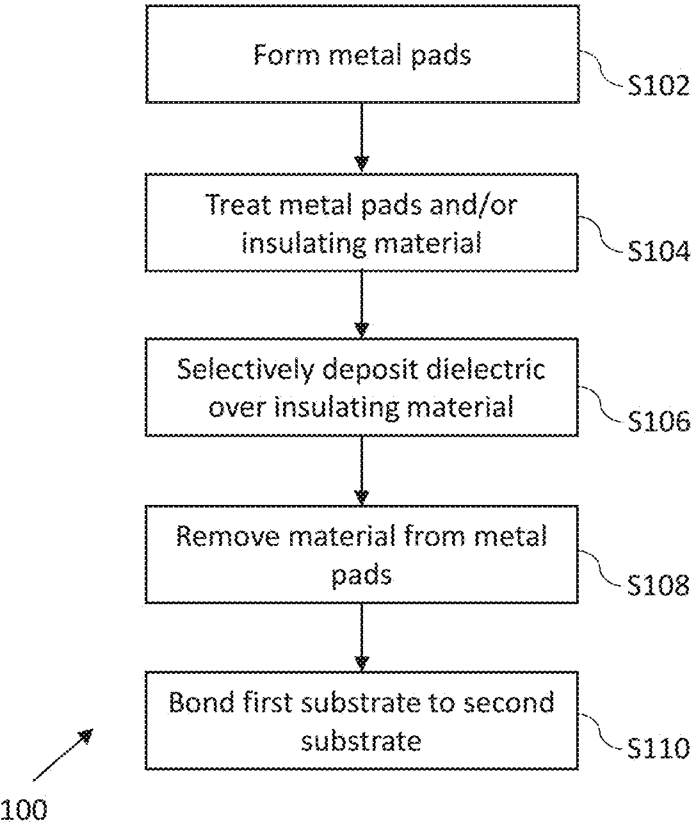
FIG. 1 illustrates a method for hybrid bonding according to an embodiment.

FIG. 1 illustrates steps of a method 100 for hybrid bonding two substrates using a selectively formed dielectric material. The first step listed in method 100 is forming metal pads at S102.

Figure 2A:
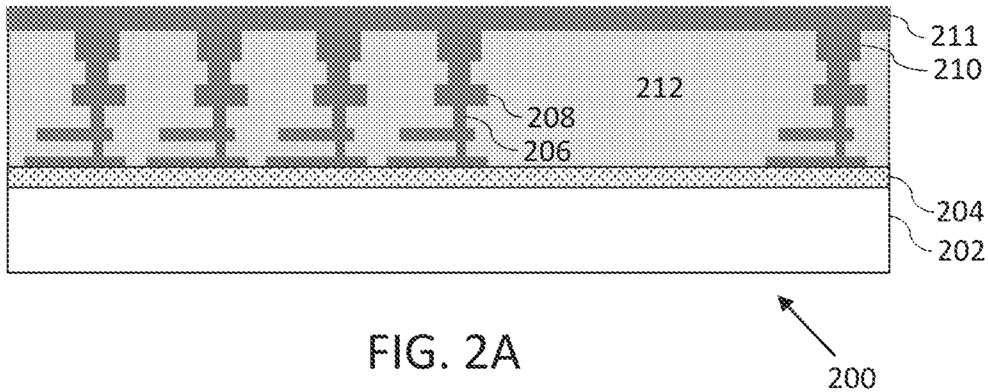
FIGS. 2A-2G illustrate process steps of a method for hybrid bonding according to an embodiment.

As seen in FIG. 2A, metal pads 210 are formed on a first semiconductor substrate 200. The first semiconductor substrate 200 includes dielectric and conductive structures formed over a bulk semiconductor substrate 202. Semiconductor materials of bulk semiconductor substrate 202 may include but are not limited to: silicon, germanium, silicon germanium, silicon carbide, gallium nitride, gallium arsenide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). The bulk substrate 202 may be a silicon-on-insulator (SOI) or a germanium-on-insulator (GOI) substrate, as examples.

The bulk substrate 202 may include a device region 204 formed over a top surface of the bulk substrate 202. The device region 204 includes active components or circuits, such as conductive features, implantation regions, resistors, capacitors, and other semiconductor elements, e.g., transistors, diodes, etc. The device region 204 is formed over the bulk substrate 202 in a front-end-of-line (FEOL) process in some embodiments. The bulk substrate 202 may include through-substrate vias (TSVs) (not shown) filled with a conductive material that provide connections from a bottom side to a top side of the bulk substrate 202.

A metallization structure is formed over the bulk substrate 202, e.g., over the device region 204 of the bulk substrate 202. The metallization structure is formed over the bulk substrate 202 in a back-end-of-line (BEOL) process in some embodiments. The metallization structure includes conductive features, such as conductive lines 208 and vias 206 formed in an insulating material 212, which is a dielectric material. In some embodiments, the insulating material 212 is made of silicon oxide. In some embodiments, the insulating material 212 includes multiple dielectric layers of dielectric materials. One or more of the multiple dielectric layers may be made of low dielectric constant (low-k) materials. In some embodiments, a top dielectric layer of the multiple dielectric layer is made of $SiO_2$.

Some vias 206 couple conductive pads 210 to conductive lines 208 in the metallization structure, and other vias 206, along with conductive metal lines 208, couple metal pads 210 to the device region 204. Vias 206 may connect conductive lines 208 together in different metallization layers, e.g. M2, M3, M4, etc. The conductive features may include conductive materials typically used in BEOL processes, such as Cu, Al, W, Ti, TiN, Ta, TaN, or multiple layers or combinations thereof.

Figure 2B:
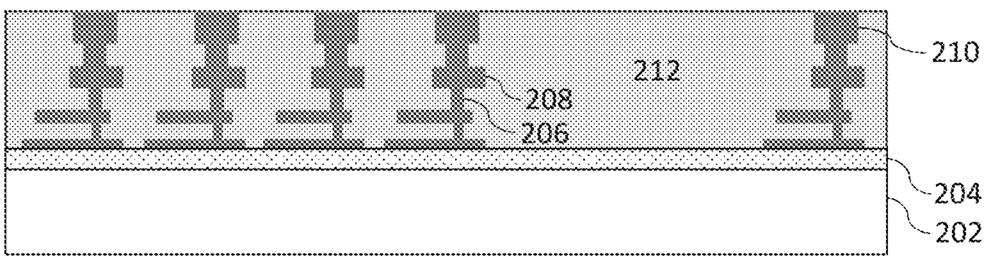

FIG. 2A shows a first semiconductor substrate 200 after a metal material 211 has been deposited over the upper surface of the substrate. The metal material 211 fills openings in the upper surface of the substrate 200 defining metal pads 210. A planarization process such as chemical mechanical polishing (CMP) is performed to remove the metal material 211 from the surface of the substrate, resulting in the structure shown in FIG. 2B and completing the step of forming the metal pads 210 at S102. The CMP process may be controlled to provide a root mean square roughness (Rq) of less than 0.5 nm on the face of the substrate 200.

The metal pads 210 are contact pads or bond pads for bonding to a second substrate. The metal pads 210 may be lined with a barrier liner as known in the art. Examples of barrier materials that may be used for the barrier liner are nitride materials such as TiN or TaN. The metal of metal pads 210 may be copper, aluminum, or other metal materials appropriate for hybrid bonding as known in the art. In an embodiment, one or more of the metal pads 210 may be a bonding via without the pad to make the direct wafer-to-wafer metal connection.

Hybrid bonding has the potential to improve performance of a wide variety of silicon technologies by providing a direct metal to metal bond across the wafer interface, thus reducing the energy per bit at higher interconnect density and larger bandwidths. When substrates are heated in a hybrid bonding process, the metal material of metal pads 210 expands more than the insulating material 212, so in the pre-bonded surface of the substrate 200, the insulating material 212 extends above the metal pads 210. Conventionally, this is achieved by depositing a dielectric layer over the surface of the substrate including the metal pads 210, patterning and etching the dielectric layer to expose the metal pads, and performing CMP planarization on the dielectric layer to recess the metal pads 210 by a precise amount, typically on the order of a few nanometers.

Photolithography is a key enabling step in feature scale definition of semiconductor devices. Photolithography is described as a "top-down" method because it starts with blanket dielectric and metal films and uses a patterned photoresist to remove material from regions where the blanket film is not wanted. The regions to be removed are defined by a physical mask which allows only part of the resist to be exposed to a lithography UV light source. The pattern formed in the resist is then transferred to the underlying film by chemical etching.

It is difficult to achieve the level of precision necessary for hybrid bonding using a top-down process. Deviations in the amount of recess and surrounding dielectric nanotopography can cause air gaps between the mating surfaces of the insulating material or metal pads, which can increase resistance or lead to device failure.

In contrast, "bottom-up" or "additive" processes deposit or create material only in regions where it is needed, avoiding the need for material removal and achieving a high degree of precision and accuracy in forming thin layers. Aspects of bottom-up processing are employed in several alternatives to lithography, including Area-selective deposition (ASD).

Area-selective deposition refers to a chemical or physical process that controllably forms a desired material layer on a desired "growth" region of an exposed surface without forming a layer on other adjacent "nongrowth" areas of different compositions or surface terminations. The growth and nongrowth regions can be differentiated by material composition, surface termination, lattice structure, or physical topography.

The growth and nongrowth regions for ASD are typically classified by how the reactants adsorb and react to these regions. Therefore, an ASD process may include surface preparation of one or more of the materials on the surface of a substrate. Materials including metal oxides, nitrides, organics, and semiconductors use terminal species, such as hydrogen, hydroxyl, amine, or methyl groups to stabilize and maintain a clean surface. Many metal surfaces are also terminated with oxygen or other species, but clean metals may only have the metal atoms exposed. Clean surfaces can be used without modification for ASD or they can be chemically or physically modified to enhance or inhibit nucleation and deposition.

Returning to FIG. 1, the first step of an ASD process is treating one or both of the exposed surface of metal pads 210 and insulating material 212 at S104. In general, ASD exploits differences in surface chemistry to selectively deposit material at specific (growth) regions on a substrate while avoiding other (non-growth) regions, and treating the exposed surfaces can alter the surface chemistry to enhance selectivity.

Figure 2C:
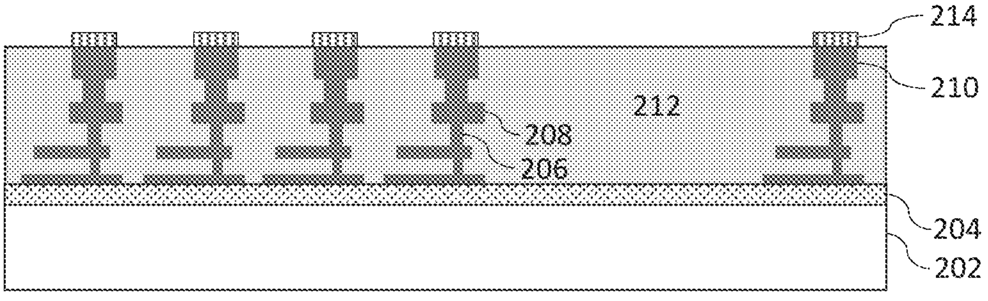

For example, as illustrated in FIG. 2C, the exposed surfaces of metal pads 210 may be treated with a layer 214 of material that inhibits growth during ASD. Depositing such a material may be referred to as a passivation process. In one exemplary embodiment in which the metal material is copper, the metal pads 210 are treated at S104 by forming a layer 214 of dodecanethiol on the copper using a self-assembled monolayer (SAM) process. In another exemplary embodiment in which the metal material is aluminum, the metal pads 210 are treated at S104 by forming a layer 214 of octadecylphosphonic acid on the exposed aluminum using an SAM process.

Of course, these materials are only two specific examples—in other embodiments, different materials may be used to treat various types of metal of the metal pads 210 to inhibit growth of a dielectric material over the metal pads 210 during ASD. The materials and techniques used to treat the metal pads 210 may be selected according to the metal material of the metal pads 210, the insulating material 212, the deposited dielectric material, the reaction chemistry, etc.

In addition or as an alternative, the insulating material 212 is treated to enhance the growth of a dielectric material at S104. For example, the surface of the substrate may be treated by a wet or vapor process to selectively adsorb or bond atoms or molecules to insulating material 212 that promote nucleation of a subsequently deposited dielectric material in an ASD process. In some embodiments, process S104 is not performed at all, and a dielectric layer 216 is selectively deposited over clean untreated surfaces of the insulating material 212.

Figure 2D:
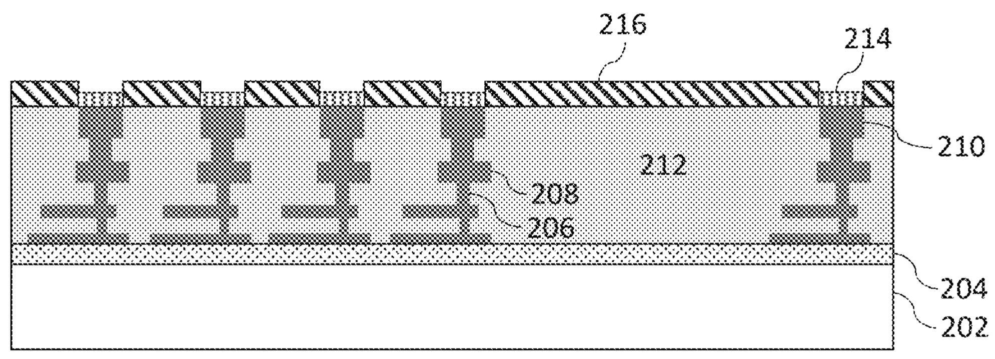

As seen in FIG. 2D, a dielectric layer 216 is selectively deposited over insulating material 212 at S106. The material of dielectric layer 216 may be a silicon-oxide material such as TEOS, SiO2 or SiOC, or any bonding dielectric that is appropriate for hybrid bonding. The dielectric layer 216 may be deposited using a vapor-based process such as chemical vapor deposition (CVD) atomic layer deposition (ALD) or molecular layer deposition (MLD). In one exemplary embodiment, a SiO2 dielectric layer 216 is deposited using O2 plasma and H as reactants. In another exemplary embodiment, bis (trichlorosilyl)-ethane and water are used as a precursor and co-reactant, respectively, to form a dielectric layer 216 of SiOC at S106 using an MLD process. The dielectric layer 216 may be formed to have a thickness of less than 10 nm. In some embodiments, the dielectric layer 216 may be formed to have a thickness from 1 to 5 nm.

When two substrates are hybrid bonded to one another, it is possible for some amount of misalignment to be present between the metal pads 210. Misalignment can cause the metal pads 210 to overlap with the insulating material 212, which can result in diffusion or migration of metal into the insulating material 212. In particular, copper tends to readily diffuse into certain oxide materials.

One approach to minimizing the effects of such misalignment is to form a relatively thick barrier layer around the metal pads 210 so that misaligned metal pads overlap the barrier layer instead of the insulating material 212. However, this approach can be costly and time consuming, complicate the bonding process, create variations in surface roughness, and may not be sufficient to account for all cases of misalignment.

To mitigate potential metal diffusion, in some embodiments, the dielectric layer 216 is a capping dielectric material that acts as a diffusion barrier. The capping dielectric material may be, for example, a nitride material such as SiCN SiN, or a low-k barrier dielectric material having the formula SiCxH. When the dielectric layer 216 is a capping dielectric material, the capping dielectric can prevent migration of the metal material of metal pads 210 into the insulating material 212 even when significant misalignment is present.

Figure 2E:
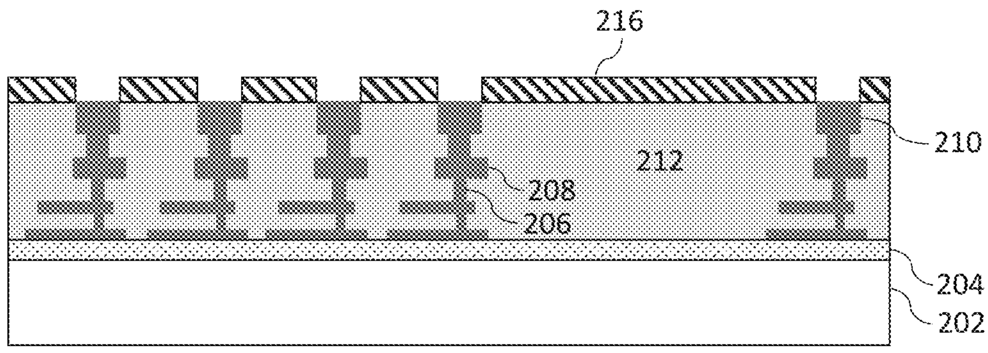

As seen in the embodiment of FIG. 2E, the treatment layer 214 is removed from the metal pads 210 at S108. The treatment layer 214 may be removed using a wet process such as acid treatment or electrochemical reduction, for example. In other embodiments, the treatment layer 214 is removed by a vapor-based cleaning process at S108. In addition to removing the treatment layer 214, the removal process may also remove any dielectric material that was incidentally deposited onto the treatment layer 214.

In some embodiments, the material that is removed from metal pads 210 at S108 is a residue from the ASD. For example, MLD deposition at S106 may leave chlorine residues on the surface of copper metal pads 210. In this example, the chlorine residues may be removed by treating the metal pads 210 with ethanol at S108. Accordingly, removing a material at S108 can apply to removing the material of a treatment layer 214 and/or removing residues from the deposition process of S106, so the material removed at S108 may be a treatment layer 214 or a residue from ASD, for example. These materials may be removed using the same or separate removal processes. Process S108 may not be performed, for example, when no treatment layer 214 is provided over the metal pads 210, e.g. process S104 is not performed, or when the treatment layer 214 does not interfere with conductivity.

Figure 2F:
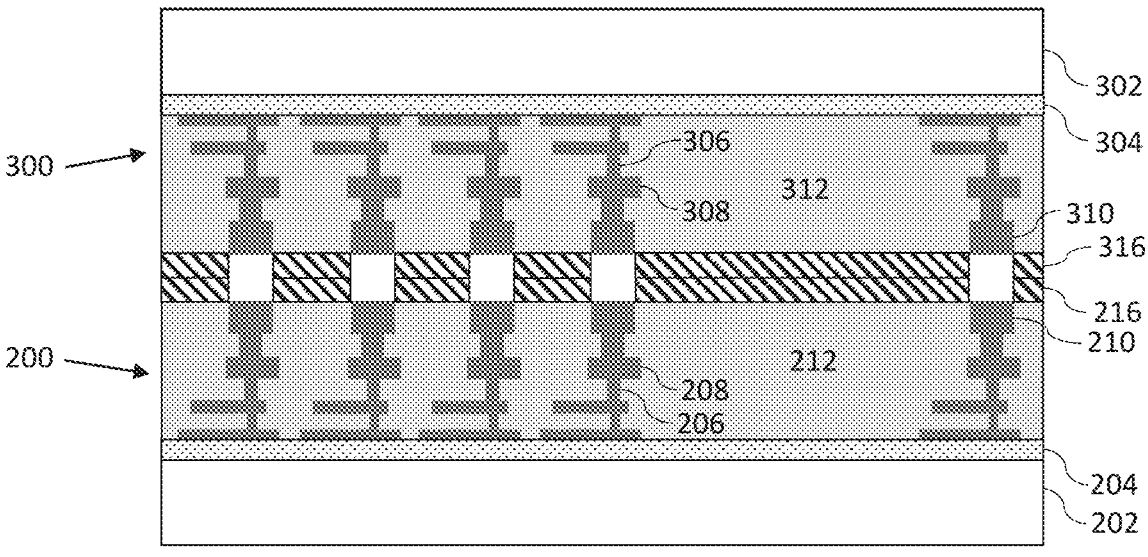

The first semiconductor substrate 200 is bonded to a second semiconductor substrate 300 at S110 as seen in FIG. 2F. The second semiconductor substrate 300 may have similar components to the first semiconductor substrate 200. For example, the second semiconductor substrate 300 may include a bulk substrate 302 of a semiconductor material and a device region 304 formed over a top surface of the bulk substrate 302.

A metallization structure may be formed over the device region 304 of the bulk substrate 302, and the metallization structure may include conductive features such as conductive lines 308 and vias 306 in an insulating material 312, which is a dielectric material. Some vias 306 may couple metal pads 310 to conductive lines 308 in the metallization structure, and other vias 306, along with conductive metal lines 308, couple metal pads 310 to the device region 304. Although the second semiconductor substrate 300 is illustrated as having the same layout and components as the first semiconductor substrate 200, this arrangement is only for ease of illustration, and the layout of the first semiconductor substrate 200 would typically be different from the layout of the second semiconductor substrate 300.

Either of the first and second semiconductor substrates 200 and 300 may be a wafer or a die. When one substrate is a wafer and the other substrate is a die, or when both substrates are dies, each die may be temporarily bonded along with other dies to a carrier substrate to facilitate the bonding process. The metal pads 310 and dielectric layer 316 of the second semiconductor substrate 300 may be formed using the same processes S102 to S108 described above with respect to the first semiconductor substrate 200. While the drawings only illustrate two bonded substrates, embodiments of the present application can be applied to stacks of three or more substrates as well.

Figure 2G:
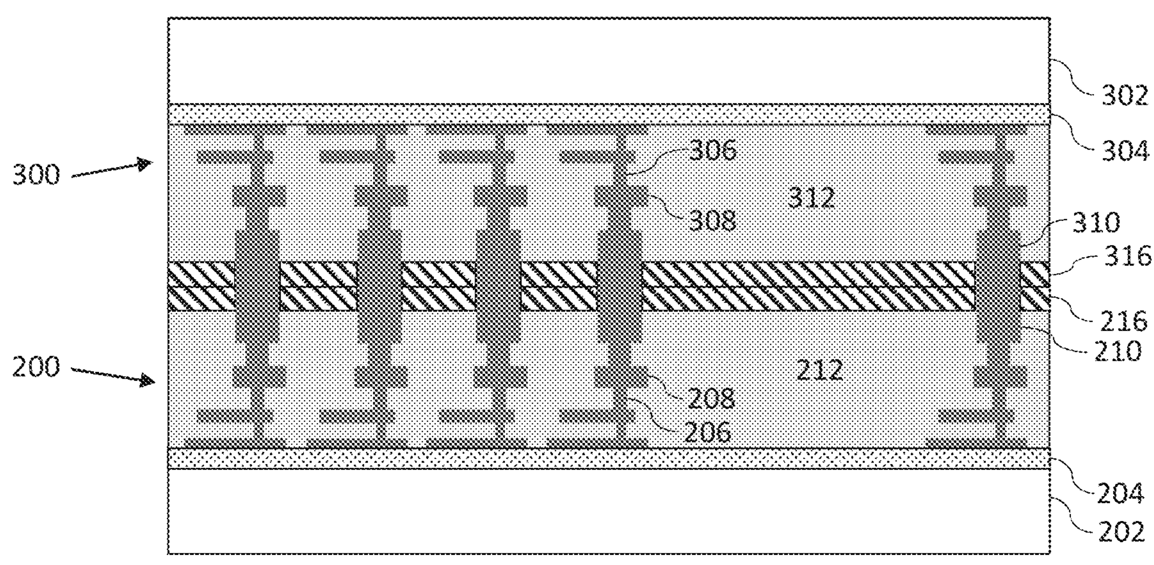

The bonding at S110 may be performed using any known or future developed hybrid bonding process. For example, the bonding surfaces or faces of the substrates may be thoroughly cleaned to remove all contamination. The face of the first substrate 200 may be aligned with and placed into contact with the face of second substrate 300 to form a bond between dielectric layers 216 and 316 at the dielectric-to-dielectric interface. Subsequently, the contacted substrates may be heated to form metal-to-metal connections between the metal pads 210 and 310. The resulting structure is two bonded substrates as shown in FIG. 2G. After the substrates are bonded, additional steps may be performed such as inter-die gap fill in which a dielectric is deposited in between, and over the top of a die when at least one of the substrates is a die.

It is especially difficult to achieve flat, consistent, and even bonding surfaces between substrates with mixed pad densities using a conventional polishing operation. One technique to minimize variation in polishing depth is to form dummy pads (which may include dummy via pads) on the surface of the substrates to fill areas without active pads. However, it is not feasible to provide dummy pads for certain applications such as photonics and RF devices. For RF devices, metal and nitrides interfere with RF switches, and metal inhibits the transmission of photons.

Figure 3:
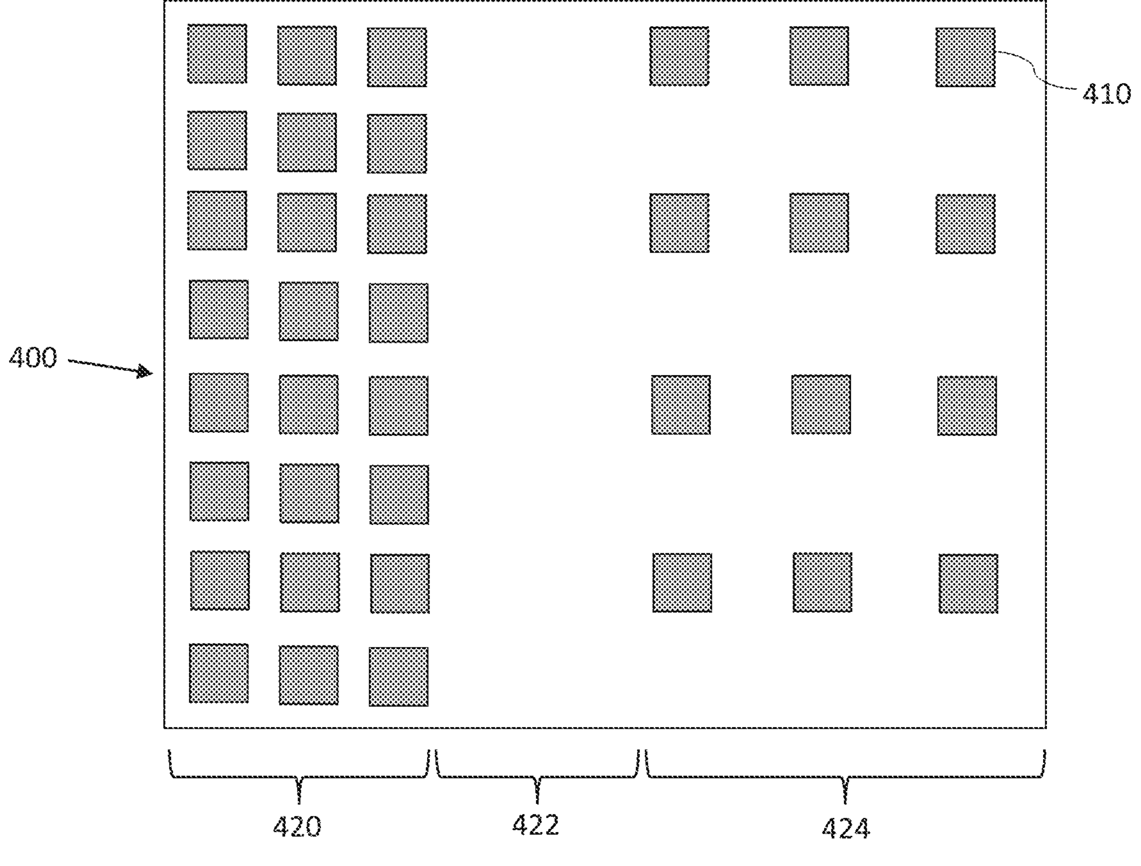
FIG. 3 illustrates an example of a substrate with mixed pad densities.

FIG. 3 illustrates an example of a substrate 400 with mixed pad densities. The substrate 400 in FIG. 3 has a first region 420 with a high density of metal pads 410, a second region 422 in which no metal pads 410 are present, and a third region 424 with a lower pad density than first region 420. The second region 422 may be, for example, a waveguide for a photonic device or an RF switch region of an RF device.

Figure 4:
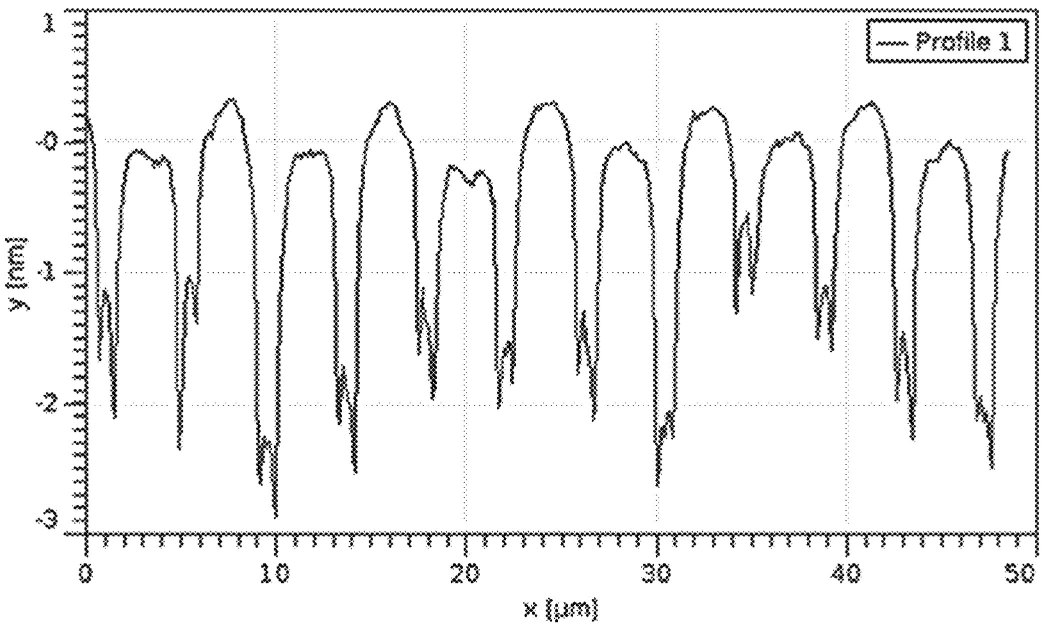
FIG. 4 illustrates a profile of a substrate with high pad density that was recessed by chemical mechanical polishing (CMP).
Figure 5:
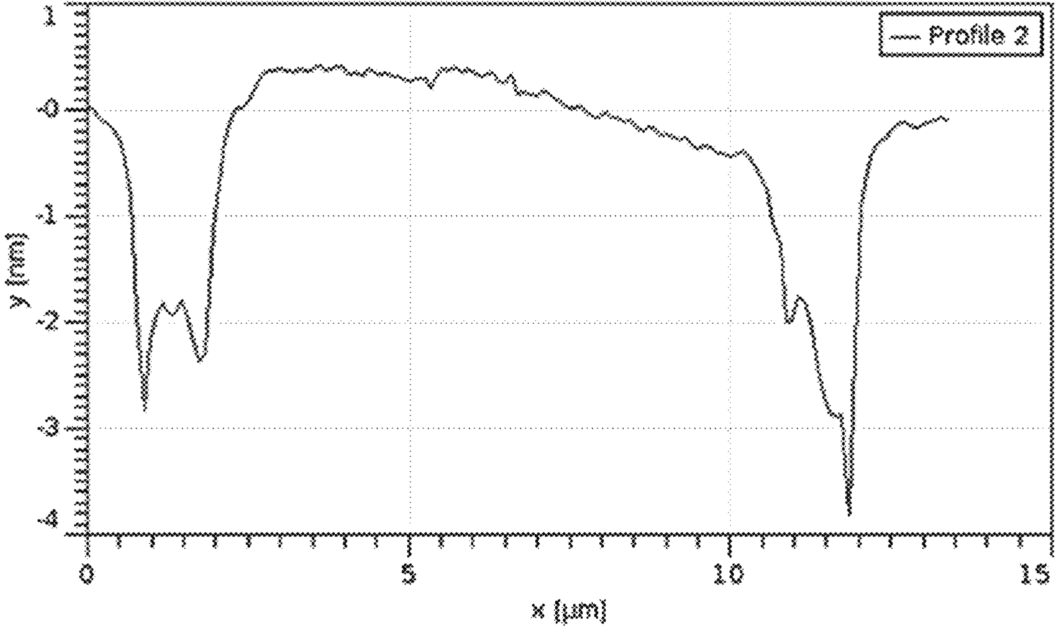
FIG. 5 illustrates a profile of a substrate with low pad density that was recessed by CMP.
Figure 6:
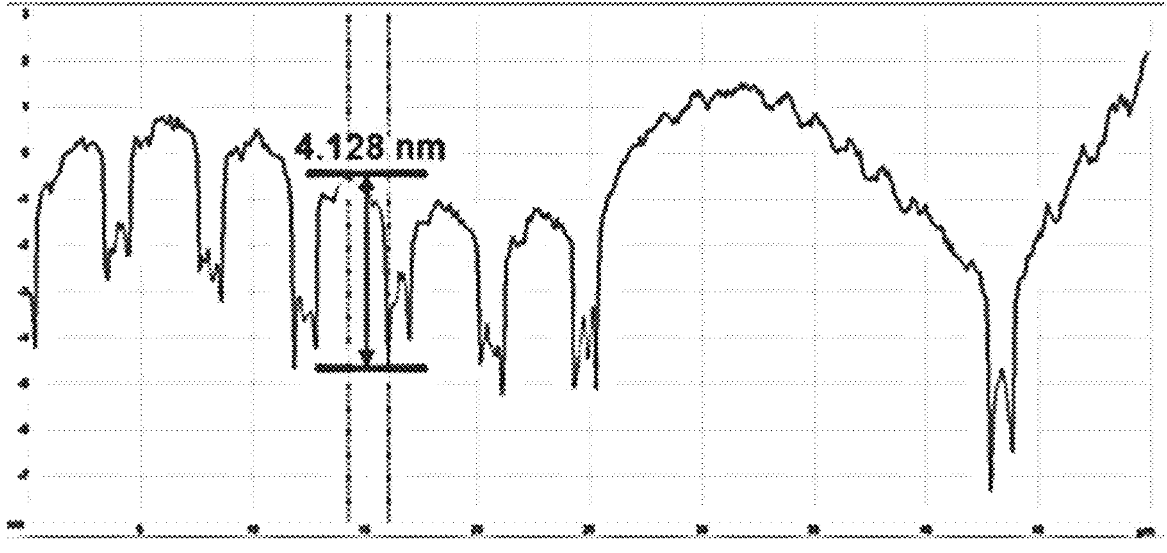
FIG. 6 illustrates a profile of a substrate with mixed pad densities that was recessed by CMP.

FIGS. 4-6 are profiles of surfaces that were recessed by CMP. The peaks of the profiles of FIGS. 4-6 represent the height of a dielectric and the valleys represent the depth of metal pads on the face of the substrate. The X-axis of these figures is μm, and the Y-axis is nm. The pad width of FIGS. 4-6 is about 1 μm, and the pad metal is copper.

As seen in FIG. 4, when pads are recessed on a relatively high-density pad region such as first region 420 of FIG. 3, the recess depth of the pads varies by about 2 nm. The spacing between pads in FIG. 4 is about 2 μm. FIG. 5 shows the results of CMP recessing of copper pads with a lower density pad region, e.g. third region 424 of FIG. 3. The pad depth varies by more than 1 nm between the two pads in FIG. 5, and the depth of the pad on the right varies by about 2 nm across the width of the pad. The target pad recess of FIG. 4 and FIG. 5 is about 2 nm.

FIG. 6 shows a similar structure with mixed pad densities and a target recess amount of about 4 nm. The pads are spaced apart by about 4 μm on the high-density pad region on the left side of the figure, and the pads are spaced apart by about 18 μm on the low-density pad region on the right side of the figure. The variation between pad recess amounts between the low-density region and the high-density region is about 5 nm, and the height of the dielectric surface varies by about 3 nm. The data in FIGS. 4-6 demonstrates that CMP recessing results in high levels of variation across the surface of substrates, and the variation is increased by low and mixed pad densities.

In contrast, embodiments of the present disclosure can achieve an Rq value of 0.5 nm or less of the dielectric, and variation between the depth of metal pad recesses of less than 1 nm. In an embodiment with mixed pad densities, the depth of metal pad recesses can vary by less than 2 nm or less than 1 nm, without the use of any dummy pads. In particular, embodiments of the present disclosure can successfully hybrid bond two or more semiconductor substrates with mixed pad densities without any dummy pads or dummy vias, and a resulting hybrid bonded device may have a more uniform thickness of an ASD dielectric layer (e.g., dielectric layers 216 and 316) in large and small pitch areas compared to a patterned dielectric layer.

In some embodiments, the pad pitch in a high-density region 424 may be from 400 nm to 5 μm, and the pad pitch in a low-density region 420 may be greater than 5 μm and up to 10 μm. However, these values are merely examples. An embodiment with mixed pad densities has at least two different regions with different pad pitches. In some embodiments, the spacing between two adjacent pads in a low-density region 420 of a substrate with mixed pad densities may be less than 4 μm, and the spacing between two adjacent pads in a high-density region 424 of the substrate may be greater than 4 μm, greater than 8 μm, or greater than 10 μm, for example. In some embodiments, the difference between the pitch densities may be at least 1 μm, at least 2 μm, at least 4 μm or at least 8 μm for example.

In an embodiment, the bonded substrates include at least one of a mixed pad density including a low-density region 424 and a high-density region 420, and a pad-free region 422. The pad-free region 422 may include a span of at least 15 μm, 20 μm, or 30 μm between adjacent metal pads 410. However, embodiments are not limited to having mixed pad densities or pad-free regions. Embodiments of the present disclosure may be applied to substrates with a single pad density, as well as to substrates with dummy pads. Selective dielectric deposition improves pad depth consistency regardless of whether dummy pads or mixed pad densities are present.

The width of metal pads 410 in an embodiment may be from 200 nm to 5 μm, for example, and a pad pitch may be 400 nm or more. The width of metal pads 410 refers to the diameter of a round pad or the width dimension of a square or rectangular pad. For a rectangular pad, the width dimension is the larger of the two orthogonal dimensions between opposite edges. In specific embodiments, the width of metal pads 410 is less than 5 μm, less than 4 μm, less than 3 μm, less than 2 μm, or less than 1 μm. The width of metal pads 410 can vary across the substrate 400. In some embodiments, the maximum width of a metal pad 410 on a substrate 400 can be greater than 5 μm.

In embodiments of the present disclosure, bonding layer planarity and few nm of pad recession can be achieved regardless of metal density and fill patterns for successful hybrid bonding. The selective deposition of dielectric material is superior to conventional approaches to recessing metal pads, leading to more uniform and reliable hybrid bonding. In addition, embodiments can use a wide variety of dielectric materials for the bond interface, presenting flexibility for choosing dielectrics with barrier properties to prevent metal diffusion from alignment mismatch and superior bonding characteristics.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A method for hybrid bonding a first wafer to a second wafer, the method comprising:

forming a first plurality of metal pads on a face of the first wafer;

forming a second plurality of metal pads on a face of the second wafer;

forming a first treatment layer over the first plurality of metal pads;

forming a second treatment layer over the second plurality of metal pads;

selectively forming a first dielectric layer over a first insulating material of the first wafer, wherein the first treatment layer inhibits the first dielectric layer from being formed over the first plurality of metal pads;

selectively forming a second dielectric layer over a second insulating material of the second wafer, wherein the second treatment layer inhibits the second dielectric layer from being formed over the second plurality of metal pads;

removing the first and second treatment layers;

placing the face of the first wafer against the face of the second wafer so that the first dielectric layer contacts the second dielectric layer, wherein the first plurality of metal pads are recessed below the first dielectric layer, and the second plurality of metal pads are recessed below the second dielectric layer; and heating the first wafer and the second wafer to bond the first plurality of metal pads to the second plurality of metal pads.

2. The method of claim 1, wherein the first dielectric layer and the second dielectric layer are formed by an area selective deposition process.

3. The method of claim 1, wherein the first and second dielectric layers are capping dielectric materials.

4. The method of claim 1, wherein a thickness of each of the first dielectric layer and the second dielectric layer is 5 nm or less.

5. The method of claim 1, wherein at least one of the first wafer and the second wafer includes an optical waveguide.

6. The method of claim 1, wherein the first wafer and the second wafer include pad-free regions over a plurality of radio-frequency switches of the first wafer.

7. The method of claim 6, wherein adjacent metal pads are separated by a space of at least 15 μm in the pad-free regions.

8. The method of claim 1, wherein the first plurality of metal pads and the second plurality of metal pads have a first pitch and a second pitch that is higher than the first pitch.

9. The method of claim 8, wherein the first pitch is 5 μm or less.

10. The method of claim 1, wherein a width of the first plurality of metal pads and the second plurality of metal pads is 5 μm or less.

11. The method of claim 1, wherein the first plurality of metal pads and the second plurality of metal pads are copper.

12. The method of claim 1, wherein each of the first and second dielectric layers have an Rq of 0.5 nm or less.

13. The method of claim 1, wherein the first and second treatment layers are self-assembled monolayers.

14. A hybrid bonded device formed by:

forming a first plurality of metal pads on a face of a first substrate;

forming a second plurality of metal pads on a face of a second substrate;

forming a first treatment layer over the first plurality of metal pads;

forming a second treatment layer over the second plurality of metal pads;

selectively forming a first dielectric layer over a first insulating material of the first substrate, wherein the first treatment layer inhibits the first dielectric layer from being formed over the first plurality of metal pads;

selectively forming a second dielectric layer over a second insulating material of the second substrate, wherein the second treatment layer inhibits the second dielectric layer from being formed over the second plurality of metal pads;

removing the first and second treatment layers;

placing the face of the first substrate against the face of the second substrate so that the first dielectric layer contacts the second dielectric layer, wherein the first plurality of metal pads are recessed below the first dielectric layer, and the second plurality of metal pads are recessed below the second dielectric layer; and heating the first substrate and the second substrate to bond the first plurality of metal pads to the second plurality of metal pads, wherein a thickness of each of the first dielectric layer and the second dielectric layer is 5 nm or less.

15. A method for hybrid bonding a first semiconductor substrate to a second semiconductor substrate, the method comprising:

forming a first plurality of metal pads on a face of the first substrate;

forming a second plurality of metal pads on a face of the second substrate;

forming a first treatment layer over the first plurality of metal pads;

forming a second treatment layer over the second plurality of metal pads;

selectively forming a first dielectric layer over a first insulating material of the first substrate, wherein the first treatment layer inhibits the first dielectric layer from being formed over the first plurality of metal pads;

selectively forming a second dielectric layer over a second insulating material of the second substrate, wherein the second treatment layer inhibits the second dielectric layer from being formed over the second plurality of metal pads;

removing the first and second treatment layers;

placing the face of the first substrate against the face of the second substrate so that the first dielectric layer contacts the second dielectric layer, wherein the first plurality of metal pads are recessed below the first dielectric layer, and the second plurality of metal pads are recessed below the second dielectric layer; and heating the first substrate and the second substrate to bond the first plurality of metal pads to the second plurality of metal pads, wherein the first and second dielectric layers are formed by an area selective deposition process.

16. The method of claim 15, wherein a thickness of each of the first dielectric layer and the second dielectric layer is 5 nm or less.

17. The method of claim 15, wherein the first plurality of metal pads and the second plurality of metal pads have a first pitch and a second pitch that is higher than the first pitch.

18. The method of claim 17, wherein the first pitch is 5 μm or less.

19. The method of claim 15, wherein at least one of the first substrate and the second substrate includes an optical waveguide.

20. The method of claim 15, wherein the first substrate and the second substrate include pad-free regions over a plurality of radio-frequency switches of the first substrate, and adjacent metal pads are separated by a space of at least 15 μm in the pad-free regions.

* * * * *